US010622087B2

(12) United States Patent
Lucas et al.

(10) Patent No.: US 10,622,087 B2
(45) Date of Patent: Apr. 14, 2020

(54) INTEGRATED CHARACTERIZATION VEHICLES FOR NON-VOLATILE MEMORY CELLS

(71) Applicant: HEWLETT PACKARD ENTERPRISE DEVELOPMENT LP, Houston, TX (US)

(72) Inventors: Jeffrey Alan Lucas, Fort Collins, CO (US); Tommy Miles, Fort Collins, CO (US); James Ignowski, Fort Collins, CO (US); William L. Wilson, Fort Collins, CO (US); Richard H. Henze, San Carlos, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 44 days.

(21) Appl. No.: 15/909,337

(22) Filed: Mar. 1, 2018

(65) Prior Publication Data

US 2019/0272886 A1    Sep. 5, 2019

(51) Int. Cl.
*G01R 31/28*     (2006.01)
*G11C 29/16*    (2006.01)
*G11C 29/26*    (2006.01)
*G01R 31/317*   (2006.01)
*G11C 29/56*    (2006.01)
*G11C 29/34*    (2006.01)

(52) U.S. Cl.
CPC ........ *G11C 29/16* (2013.01); *G01R 31/31724* (2013.01); *G11C 29/26* (2013.01); *G11C 29/34* (2013.01); *G11C 29/56* (2013.01)

(58) Field of Classification Search
CPC ......... G11C 29/16; G11C 29/26; G11C 29/56; G11C 29/34; G01R 31/31724
See application file for complete search history.

(56) References Cited

U.S. PATENT DOCUMENTS

| 5,128,737 | A | 7/1992 | Van der Have et al. |
| 5,675,544 | A | 10/1997 | Hashimoto et al. |
| 6,301,166 | B1 | 10/2001 | Ooishi et al. |
| 7,353,442 | B2 | 4/2008 | Bahl et al. |
| 8,261,138 | B2 | 9/2012 | Chang et al. |
| 2011/0095774 | A1* | 4/2011 | Pickett ............... G01R 31/2637 324/750.14 |
| 2019/0205741 | A1* | 7/2019 | Gupta .................. G06N 3/0635 |

OTHER PUBLICATIONS

Blanton, R.D. et al., "Logic Characterization Vehicle Design for Maximal Information Extraction for Yield Learning", International Test Conference, 2014 IEEE, Paper 24.3, pp. 1-10.

* cited by examiner

*Primary Examiner* — Samir W Rizk
(74) *Attorney, Agent, or Firm* — Hewlett Packard Enterprise Patent Department

(57) ABSTRACT

In example implementations, an integrated characterization vehicle is provided. The integrated characterization vehicle includes a memristor, a configuration cache and an analog measurement tile. The memristor has a driving unit to limit an amount of current that is driven through the memristor during testing. The configuration cache provides test parameters to control the testing of the memristor. The analog measurement tile provides a voltage to the memristor in accordance with the test parameters and to record a response of the memristor.

6 Claims, 4 Drawing Sheets

100

INTEGRATED CHARACTERIZATION VEHICLES FOR NON-VOLATILE MEMORY CELLS

BACKGROUND

Computers may use memory to store information. Memory devices can include volatile memory and non-volatile memory. Volatile memory devices use a constant power source in order to prevent data from being erased. In contrast, non-volatile memory cells may include devices that can store a value even when current or power is turned off to the device. Examples of non-volatile memory cells may include read-only memory, flash memory, random access memory, magnetic computer storage devices, optical discs, and the like.

DETAILED DESCRIPTION

Examples described herein provide non-volatile memory cells having integrated characterization vehicles. An example of the non-volatile memory cell may include a memristor. Memristors are memory devices that can store a resistance value based on current values that have previously passed through the memristor. The memristor may have two terminals that allow current to flow through the memristor in two different directions. When current is driven in a first direction through the memristor, the resistance can go down. When current is driven in a second direction that is opposite the first direction through the memristor, the resistance can go up. When current is low or zero, the resistance may be stable, thus storing the resistance value.

The memristor may be used to provide digital information (e.g., a high value or a low value). The memristor may also be used to provide analog information (e.g., a range of resistance values).

Currently, memristors are tested with external equipment, with resulting high levels of parasitic capacitance. In addition, when the memristors are tested, the changes in resistance can cause large amounts of current to be dumped throughout the memristor. For example, based on the relationship voltage equals current times resistance (e.g., V=IR), when the memristor is under a constant voltage source and the resistance suddenly drops, the current will suddenly increase. Thus, the memristors may be a relative large size (e.g., 1 to 10 microns (um)×1 to 10 um) to improve robustness to these high levels of parasitic current.

The large energy dumps in the memristor can cause unpredictable responses or distorting effects in the memristor. The present disclosure provides an integrated characterization vehicle in the memristor devices. As a result, memristor can be tested without external equipment. In addition, the integrated characterization vehicle can be designed to limit the amount of current that can be driven through the memristor.

One benefit of the integrated characterization vehicle is that the size of the memristors can be significantly reduced. For example, the memristors can be 20 nm×20 nm rather than 1 to 10 microns. In addition, the integrated characterization vehicles may limit the current as noted above to prevent damage to the memristors and unwanted energy dumps into the memristor that can create undesirable side-effects. These smaller memristor sizes have different characteristics than the larger sizes and understanding the characteristics of the smaller memristors is required for viable products.

In addition, the characterization vehicle of the present disclosure may provide a common platform to study memristors fabricated at a manufacturing scale. For example, the characterization vehicle may be used to study impacts of manufacturing process changes on device margins, or on device behavior for a population of devices.

Figure 1:
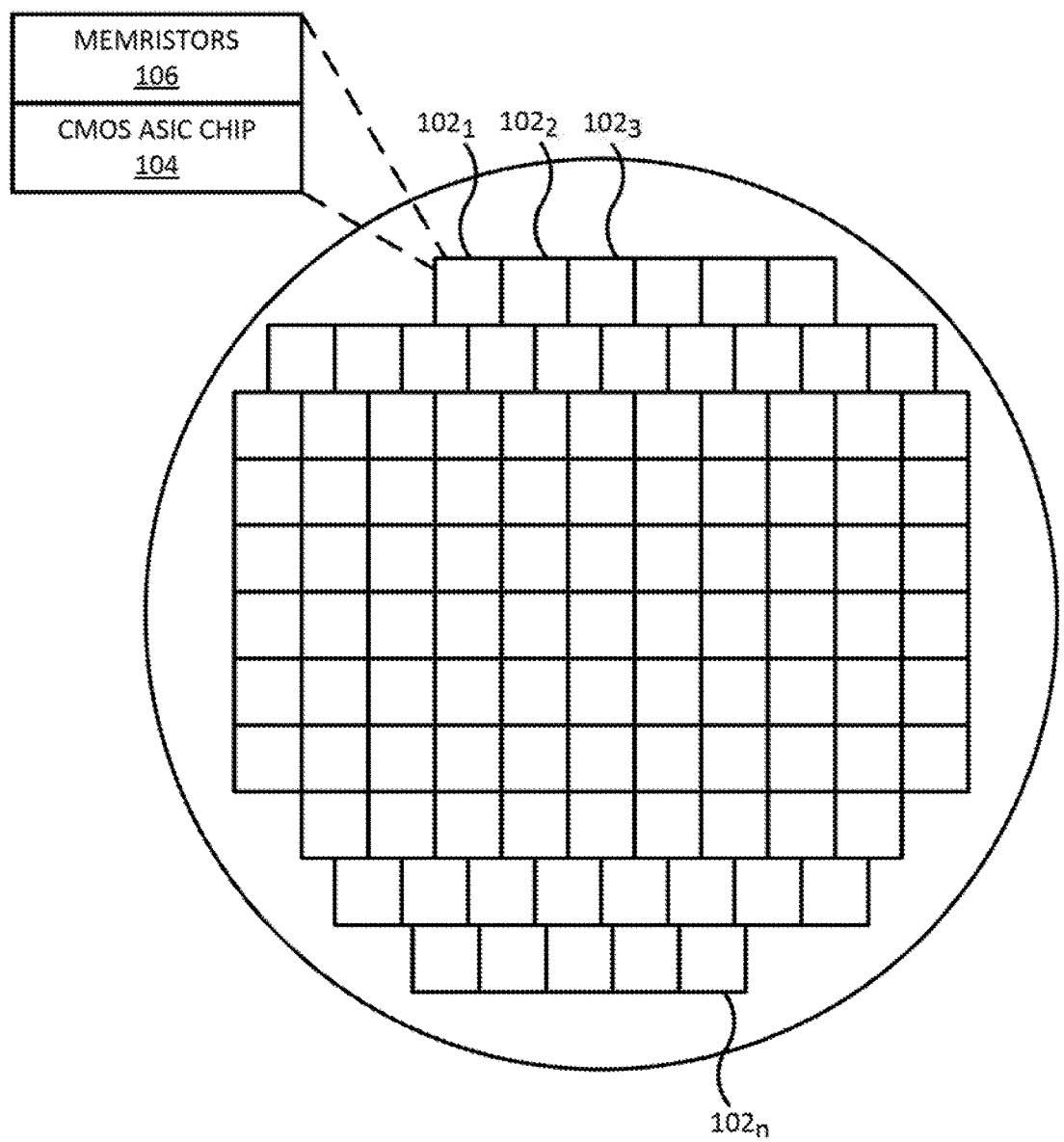
FIG. 1 is a block-diagram of an example wafer having a plurality of memristors and integrated characterization vehicles of the present disclosure.

FIG. 1 illustrates an example wafer 100 comprising a plurality of integrated characterization vehicles (CVs) $102_1$ to $102_n$ (hereinafter also referred to individually as an integrated CV 102 or collectively as integrated CVs 102). FIG. 1 illustrates a block diagram of the CV 102 that is illustrated in further details in FIGS. 2 and 3, and discussed in further detail below.

In one example, each one of the integrated CVs 102 may include a complementary metal oxide semiconductor (CMOS) application specific integrated circuit (ASIC) chip 104. Memristors 106 may be fabricated on top of the CMOS ASIC chip 104. As noted above, the memristors 106 may be a type of non-volatile memory device. The memristors 106 may also be referred to herein as a non-volatile memory device.

In one example, the integrated CVs 102 of the present disclosure may be formed using a process flow similar to a process flow for manufacturing CMOS devices. The CMOS ASIC chip 104 may be a silicon based ASIC chip that performs the testing functions described in further detail below.

The wafer 100 may be processed to form the CMOS ASIC chips 104. The wafer 100 may then be transferred to a back end of line (BEOL) processing to passivate the wafer 100 and fabricate the memristors 106 on top of the CMOS ASIC chips 104 to complete the fabrication of the integrated CVs 102.

In one example, each integrated CV 102 may be organized into eight identical "slices". Each slice may include a 256×12 array of memristors 106 of a particular integrated CV 102. In other words, each integrated CV 102 may control testing for each memristor 106 in a respective 256×12 array of memristors 106. However, it should be noted that any number of slices, and any number of memristors 106, may be deployed for each integrated CV 102.

Figure 2:
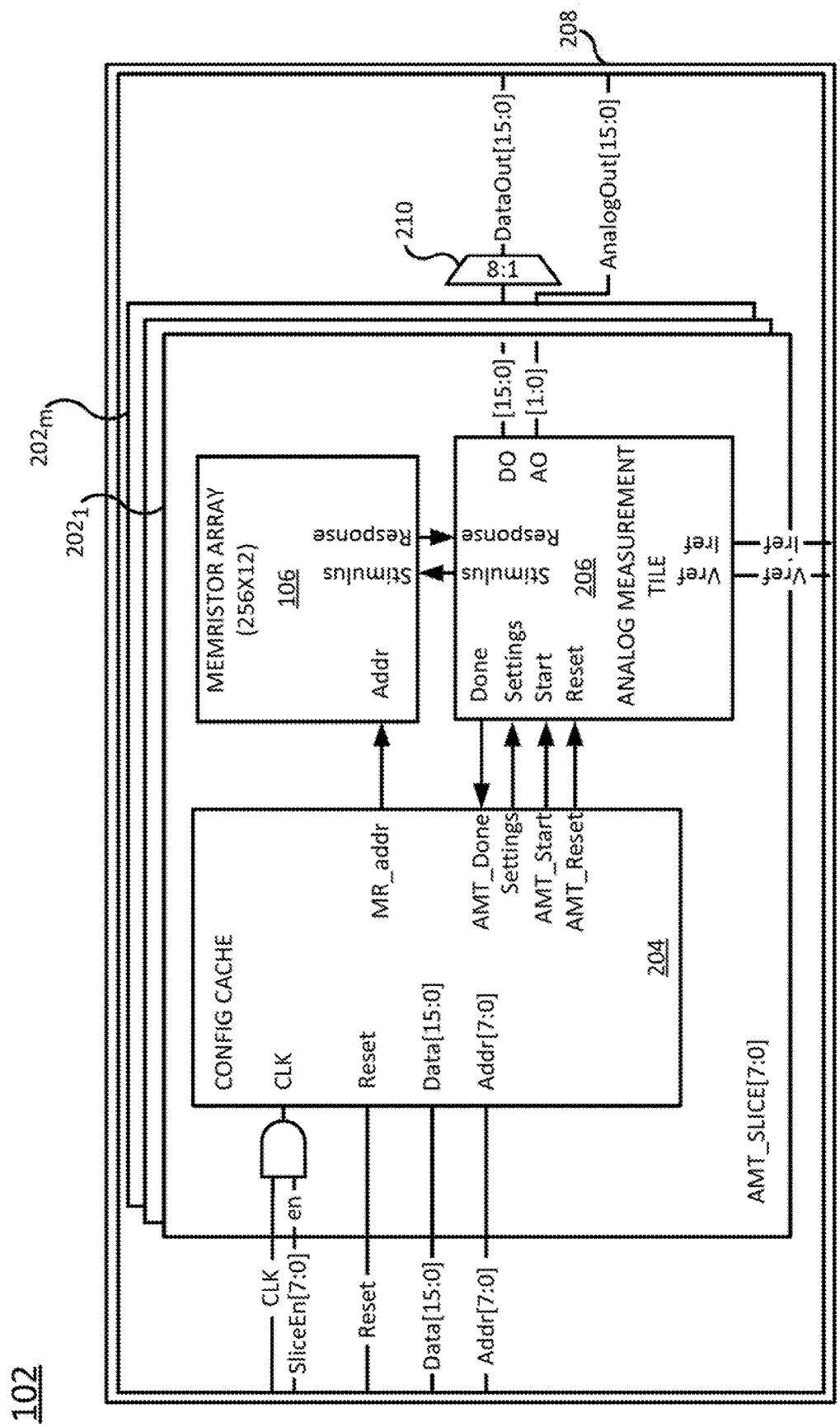
FIG. 2 is a block diagram of an example integrated characterization vehicle of the present disclosure.

FIG. 2 illustrates a block diagram of an example integrated CV 102. The integrated CV 102 controls a plurality of slices $202_1$ to $202_m$ (hereinafter also referred to individually as a slice 202 or collectively as slices 202). In other words, each integrated CV 102 may control a respective group of slices $202_1$ to $202_m$. Said another way, each integrated CV 102 may have its own set of slices $202_1$ to $202_m$. In one example, the slices 202 may also be referred to as an analog measurement tile (AMT) slice.

In one example, each slice 202 may include a configuration cache 204, an analog measurement tile (AMT) 206, and an array of memristors 106. In one example, the configuration cache 204 may provide signaling to control testing of the memristors 106, parameters associated with the testing of the memristors 106, and the like.

In one example, the configuration cache 204 may include a clock (CLK) pin, a reset pin, a data pin, an address (Addr) pin, a memristor address (MR_addr) pin, an AMT_done pin, a settings pin, an AMT_Start pin, and an AMT_Reset pin. The clock pin can provide time measurements for the testing. The reset pin may provide a signal from the integrated CV 102 to reset the testing or state machine of the integrated CV 102. For example, the configuration cache 204 may transmit a signal to the AMT 206 via the AMT_Reset pin.

The data pin and the address pin may provide parameters associated with settings to be used for the testing. The data pin may provide the data associated with the parameters and the address pin may select a register of the configuration cache. For example, the parameters may include information such as a counter value, a pulse width, an amount of current, an amount of voltage, a direction of the current, a time period, and the like. Each parameter may be stored in a different register. The parameters may then be provided to the AMT 206 via the settings pin. Although FIG. 2 illustrates the data pin being a 16 bit pin and the address pin being an 8 bit pin, it should be noted that the data pin and the address pin may include any number of bits.

The MR_addr pin may address each memristor 106 of the array of memristors 106. In other words, the MR_addr pin may help address each memristor 106 independently, help keep track of which memristor 106 is being tested, and track which response is associated with which memristor 106.

The AMT_Start pin may send a signal to the AMT 206 to start the testing. The AMT_Done pin may receive a signal from the AMT 206 indicating that the testing has been completed.

In one example, the AMT 206 may include a done pin, a settings pin, a start pin, a reset pin, a stimulus pin, a digital out (DO) pin, and an analog out (AO) pin. The settings pin may receive the parameters for testing from the settings pin of the configuration cache 204. The start pin of the AMT 206 may receive the start signal from the configuration cache 204. The reset pin of the AMT 206 may receive the reset signal from the configuration cache 204. The done pin of the AMT 206 may send a signal to the AMT_Done pin of the configuration cache 204 indicating that the testing is completed.

In one example, the AMT 206 may include a reference voltage ($V_{ref}$) pin and a reference current ($I_{ref}$) pin. The AMT 206 may receive the reference voltage and/or the reference current via the $V_{ref}$ pin and the $I_{ref}$ pin, respectively. The $V_{ref}$ pin and the $I_{ref}$ pin may come off of the integrated CV 102. The $I_{ref}$ current may be generated on the integrated CV 102 (e.g., internal to the AMT 206). The $I_{ref}$ pin coming off of the integrated CV 102 may be for calibration measurements.

In one example, $V_{ref}$ may be generated off the integrated CV 102 (e.g., from a testing board). In another example, $V_{ref}$ may be generated on the integrated CV 102 (e.g., using a digital to analog convertor). In this case, the $V_{ref}$ may come off of the integrated CV 102 and also be used for calibration measurements.

The AMT 206 may test each one of the memristors 106 in the array via the stimulus pin or pins. The memristor 106 that is being tested may be based on the memristor selected by the configuration cache 204 via the MR_addr pin. Each memristor 106 may have an address (Addr) pin that may allow a particular memristor 106 know it has been selected for testing. Each memristor 106 may include a stimulus pin, or pins, and a response pin, or pins, to receive the stimulus from the AMT 206 and provide a response back to the AMT 206. In one example, the design of the integrated CV 102 allows many memristors 106 to be tested simultaneously and more efficiently.

In addition, the integrated CV 102 removes the use of probes and other external testing equipment. As a result, the memristors 106 may be manufactured with smaller dimensions (e.g., 20 nm×20 nm versus several microns). In addition, parasitic effects and other variations imposed by probing with external test equipment may be eliminated in assessing the statistical behavior over a population of evaluated devices.

In one example, the DO pin of the AMT 206 may provide status bits of the testing. Each status bit may represent an indication of a quality of the testing results. For example, the quality of results may be based on whether a status was reached or not. The status may include items such as whether the maximum signal range was hit, what gain setting was used, and the like. The DO pin may use a 16 bit status indicator. In one example, a multiplexer 210 may be used to multiplex the status of each slice 202 into a single output.

Figure 3:
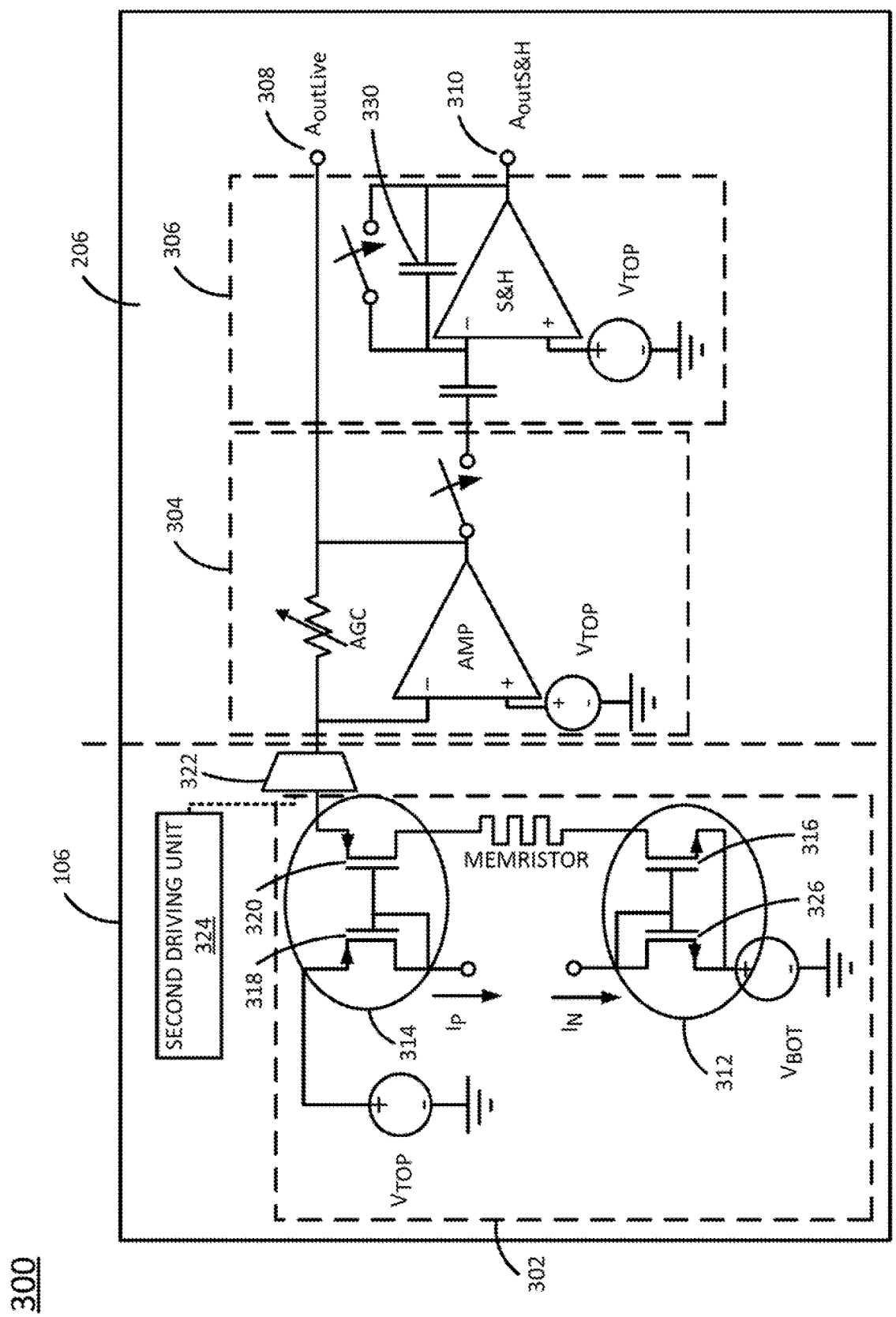
FIG. 3 is an example circuit diagram of the integrated characterization vehicle of the present disclosure.

The AO pin of the AMT 206 may include two different analog outputs as illustrated in FIG. 3 and discussed below. The analog outputs may be the responses for each memristor 106 that were observed during the testing. As discussed in further details below, the analog outputs may include a live channel and a sample and hold channel.

FIG. 3 illustrates an example circuit diagram 300 of the memristor 106 and the AMT 206. In one example, the memristor 106 may include circuitry that is enclosed by a dashed line 302. The memristor 106 may include a driving unit 302 and a second driving unit 324. In one example, the driving units 302 and 324 may be used both for writing and reading resistance values of the memristors 106 on an integrated CV 102. Details of the driving unit 302 are illustrated in FIG. 3, however, the circuitry of the second driving unit 324 may be identical to the circuitry of the driving unit 302 except that current is driven through the second driving unit 324 in an opposite direction.

In other words, the memristor 106 may be coupled to a pair of driving units 302 and 324. The driving unit 302 may drive current in a first direction and the second driving unit 324 may drive current in a second direction that is opposite the first direction. For example, the driving unit 302 may have a top voltage (Vtop) and a bottom voltage (Vbot) and the current may flow in a direction from top to bottom. The second driving unit 324 may have the Vtop and the Vbot reversed such that the current may flow in a direction from a bottom to top. As described above, the amount of current and the different direction of the current may be used to set the resistance value of the memristor 106.

In one example, the driving unit 302 may include a pair of current mirrors 312 and 314. Similarly, the second driving unit 324 may also have a pair of current mirrors. The current mirror 312 may include a pair of N-type metal oxide semiconductor (NMOS) transistors 326 and 316. The NMOS transistor 316 may mirror the current that is driven across the N-type transistor 326. The current, $I_N$, that is driven across the NMOS transistor 326 may be predefined or set to limit the amount of current that is driven through the memristor 106. For example, the current, $I_N$, may be set as a parameter by the integrated CV 102 in the configuration cache 204.

As discussed above, the design of the integrated CV 102 prevents excessive current from being dumped throughout the memristor 106 that can lead to undesirable results or unpredictable responses. The current mirror 312 may set a current limit. Thus, the amount of current that flows through the NMOS transistor 316 may be limited by the current limit, $I_N$, seen by the NMOS transistor 326.

In one example, the current mirrors 312 and 314 may be designed to have extremely low parasitic capacitance at the drain terminals. This may serve to reduce unintended current dumping into the memristor when resistance changes. For example, design techniques such as minimizing the driving unit transistor drain areas (e.g., minimizing transistor width for the required current range) and placing the driving unit transistors directly below the location of the memristor fabrication site (e.g., to minimize coupling capacitances associated with routing connections through the CMOS device and metal layers) may be employed to achieve this goal.

Similarly, the current mirror 314 may include a pair of P-type metal oxide semiconductor (PMOS) transistors 318 and 320. The current, $I_P$, that is driven across the PMOS transistor 318 may be predefined or set to limit the amount of current that is driven through the memristor 106. The current, $I_P$, may also be set as a parameter by the integrated CV 102 in the configuration cache 204. The amount of current that flows through the PMOS transistor 320 may be limited by the current limit, $I_P$, seen by the PMOS transistor 318. The current $I_P$ and $I_N$ may be set to be the same value.

In one example, the circuit 300 may include an N to 1 multiplexer 322 that is communicatively coupled to the first driving unit 302 and the second driving unit 324. The N to 1 multiplexer 322 may combine the responses of the memristor into a single signal that is transmitted to the AMT 206.

In one example, the AMT 206 may include a transimpedance amplifier represented by dashed lines 304 and a sample and hold output represented by dashed lines 306. In one example, the portions 304 and 306 of the AMT 206 may be active when reading a resistance value of the memristors 106, unlike the driving units 302 and 324 that are used for both writing and reading the resistance values of the memristors 106.

In one example, the transimpedance amplifier may convert a current from the driving units 302 and 324 into a voltage. The voltage may be provided as a value over a live output or channel ($A_{out\ live}$) 308. The live output 308 may be connected to an external monitor or system that allows the responses from testing the memristors 106 to be monitored live, or as the testing is occurring.

In one example, the transimpedance amplifier may include an analog gain controller (AGC) and an amplifier (AMP). The AGC may control a signal amplitude even as the amplitude of the output signal may vary for the output on the live channel 308.

In one example, the sample and hold output may generate an output on a sample and hold (S&H) output or channel ($A_{out\ S\&H}$) 310. The sample and hold output 310 may be an output of a stored value. In other words, the responses from the memristors may be stored and retrieved at a later time via the sample and hold channel 310. The sample and hold output may include an S&H amplifier and a capacitor 330 to temporarily store the responses from the memristors 106. In one example, an analog to digital converter may be used to digitize the value from the channel 310. The analog to digital converter may be external to the integrated CV 102 or be designed to be part of the integrated CV 102.

Figure 4:
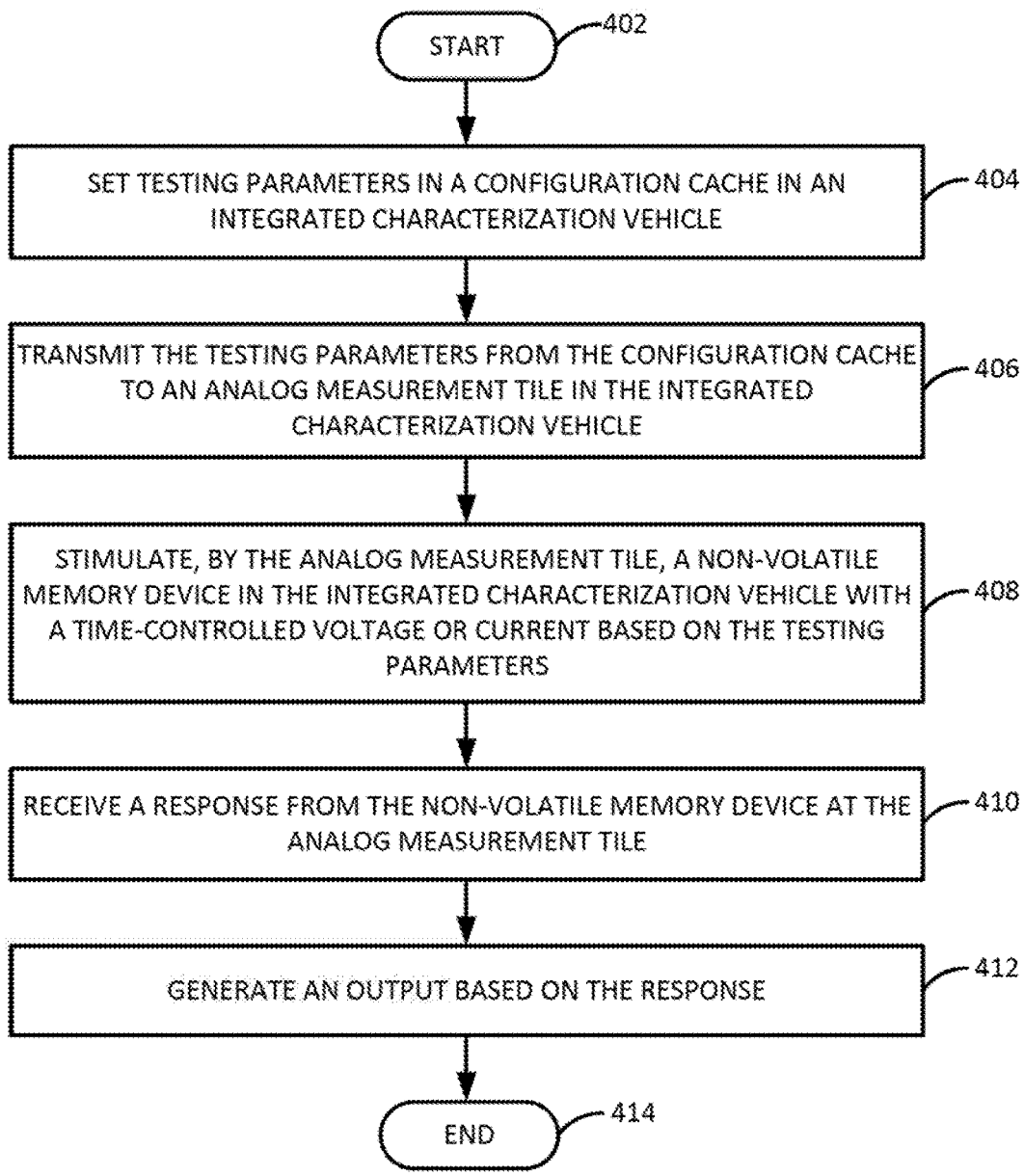
FIG. 4 is an example flow chart of a method for testing a memristor of the present disclosure.

FIG. 4 illustrates a flow diagram of an example method 400 for testing a non-volatile memory device (e.g., a memristor). In one example, the method 400 may be performed by the integrated CV 102.

At block 402, the method 400 begins. At block 404, the method 400 sets testing parameters in a configuration cache in an integrated characterization vehicle. For example, testing parameters may be provided and stored in different registers of the configuration cache via a data pin and an address pin, as described above.

In one example, the testing parameters may provide the configuration cache the ability to sequence multiple memristor simulation events automatically. For example, the sequence may include a plurality of writes to a memristor, then a read, then a write with different parameters, then a current mode read, and a voltage mode read. In other words, the control logic in the command cache may implement a variety of instructions and/or commands that apply stimuli on the memristors. The control logic of the command cache may allow for large numbers of commands to be performed in an automated fashion on a large number of memristor addresses. Thus, although the method 400 as described below provides an example of a simple stimulus/response the configuration cache may allow for a more complicated sequence of testing of many different memristors for an extended length of time.

At block 406, the method 400 transmits the testing parameters from the configuration cache to an analog measurement tile in the integrated characterization vehicle. The testing parameters may be transmitted to the AMT via a settings pin, as described above. The configuration cache may then signal the AMT to start testing in accordance with the testing parameters.

At block 408, the method 400 stimulates, by the analog measurement tile, a non-volatile memory device in the integrated characterization vehicle with a time-controlled voltage or current based on the testing parameters. The non-volatile memory device may be a memristor. In one example, the AMT may apply a time-controlled voltage and/or a current on the memristors via a stimulus pin connected to each one of the memristors. For example, the time-controlled voltage and/or current may be a periodic signal wherein the period may be defined by the testing parameters. The stimulating may include driving current across the memristors in different directions, in different amounts, for different lengths of time, and so forth to test the operation of the non-volatile memory devices. For example, the testing may determine whether the memristors are functioning properly (e.g., responding to changes in the current, changes in the current direction, storing resistance values properly, and the like).

In one example, the stimulating may include changing the direction of the current driven through the non-volatile memory device to change a resistance value of the non-volatile memory device. As noted above, the integrated CV may be designed to limit an amount of current based on a pre-defined current limit set in a pair of driving units coupled to the non-volatile memory device during the changing of the direction of the current.

At block 410, the method 400 receives a response from the non-volatile memory device at the analog measurement tile. The non-volatile memory devices that are being tested may transmit a response back to the AMT via a response pin, as discussed above.

At block 412, the method 400 generates an output based on the response. In one example, the analog output may be a live output. For example, the live output may be sent to an external monitor or computing system that allows the responses from the non-volatile memory devices to be observed or monitored as the testing is being performed.

In another example, the analog output may be a stored output. For example, the responses may be stored in a sample and hold output portion of the AMT. The responses may be digitized by an analog to digital converter and then be viewed at a later time.

In one example, after testing of the non-volatile memory devices is completed, the configuration cache may send a reset signal to the AMT via an AMT_Reset pin, as described above. The reset signal may reset a state machine of the integrated CV to allow for another cycle of testing or testing with new testing parameters. At block 414, the method 400 ends.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

The invention claimed is:

1. A circuit, comprising:
   a pair of driving units coupled to a non-volatile memory device, wherein each one of the pair of driving units comprises a pair of current mirrors to limit an amount of current across the non-volatile memory device;
   an N to 1 multiplexer communicatively coupled to the driving unit;
   a transimpedance amplifier to convert a current from the driving unit to a voltage;
   a live output coupled to the transimpedance amplifier; and
   a sample and hold output coupled to the transimpedance amplifier.

2. The circuit of claim 1, comprising:
   a plurality of pairs of driving units, wherein each one of the plurality of pairs of driving units are coupled to the N to 1 multiplexer.

3. The circuit of claim 1, wherein a first driving unit of the pair of driving units drives the amount of current in a first direction across the non-volatile memory device and a second driving unit of the pair of driving units drives the amount of current in a second direction across the non-volatile memory device, wherein the first direction is opposite the second direction.

4. The circuit of claim 1, wherein a first current mirror of the pair of current mirrors comprises a pair of p-type metal oxide semiconductor (PMOS) transistors coupled to the memristor, wherein one side of the first current mirror has a pre-defined current limit value.

5. The circuit of claim 4, wherein a second current mirror of the pair of current mirrors comprises a pair of n-type metal oxide semiconductor (NMOS) transistors coupled to the non-volatile memory device, wherein one side of the second current mirror has the pre-defined current limit value.

6. The circuit of claim 1, wherein transimpedance amplifier, the live output, and the sample and hold output are deployed as an analog measurement tile in communication with the non-volatile memory device and a configuration cache that controls testing of the non-volatile memory device.

* * * * *